United States Patent
Scheuerlein

(10) Patent No.: US 7,829,875 B2
(45) Date of Patent: Nov. 9, 2010

(54) NONVOLATILE REWRITABLE MEMORY CELL COMPRISING A RESISTIVITY-SWITCHING OXIDE OR NITRIDE AND AN ANTIFUSE

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 681 days.

(21) Appl. No.: 11/395,421

(22) Filed: Mar. 31, 2006

(65) Prior Publication Data

US 2007/0228354 A1    Oct. 4, 2007

(51) Int. Cl.
*H01L 45/00* (2006.01)

(52) U.S. Cl. .............. 257/2; 257/530; 257/4; 365/148; 365/153

(58) Field of Classification Search .......... 257/530, 257/2
See application file for complete search history.

(56) References Cited

U.S. PATENT DOCUMENTS

| | | | |
|---|---|---|---|
| 2,655,609 A | 10/1953 | Shockley | |
| 2,971,140 A | 12/1959 | Chappey et al. | |
| 3,796,926 A | 3/1974 | Cole et al. | |
| 4,204,028 A | 5/1980 | Donley | |
| 4,499,557 A | 2/1985 | Holmberg et al. | |
| 4,646,266 A | 2/1987 | Ovshinsky et al. | |
| 4,772,571 A | 9/1988 | Scovell et al. | |
| 4,907,054 A | 3/1990 | Berger | |
| 4,940,553 A | 7/1990 | von Benda | |
| 5,037,200 A | 8/1991 | Kodama | |
| 5,166,758 A | 11/1992 | Ovshinsky et al. | |
| 5,273,915 A | 12/1993 | Hwang et al. | |
| 5,311,055 A | 5/1994 | Goodman et al. | |
| 5,774,394 A | 6/1998 | Chen et al. | |
| 5,854,102 A | 12/1998 | Gonzalez et al. | |
| 5,876,788 A | 3/1999 | Bronner et al. | |
| 5,915,167 A | 6/1999 | Leedy | |

(Continued)

FOREIGN PATENT DOCUMENTS

EP    1 308 960 A2    5/2003

(Continued)

OTHER PUBLICATIONS

Baek et al., "Multi-layer Cross-point Binary Oxide Resistive Memory (OxRRAM) for Post-NAND Storage Application", Dec. 5, 2005, Electron Devices Meeting, 2005, IEDM Technical Digest, IEEE International Dec. 5, 2005, Piscataway, NJ, USA, IEEE, pp. 750-753.

(Continued)

*Primary Examiner*—Jerome Jackson, Jr.
(74) *Attorney, Agent, or Firm*—Dugan & Dugan, PC

(57) ABSTRACT

A memory cell is described, the memory cell comprising a dielectric rupture antifuse and a layer of a resistivity-switching material arranged electrically in series, wherein the resistivity-switching material is a metal oxide or nitride compound, the compound including exactly one metal. The dielectric rupture antifuse is ruptured in a preconditioning step, forming a rupture region through the antifuse. The rupture region provides a narrow conductive path, serving to limit current to the resistivity-switching material, and improving control when the resistivity-switching layer is switched between higher- and lower-resistivity states.

31 Claims, 6 Drawing Sheets

U.S. PATENT DOCUMENTS

| | | | |
|---|---|---|---|
| 6,034,882 A | 3/2000 | Johnson et al. | |
| RE37,259 E | 7/2001 | Ovshinsky | |
| 6,369,431 B1 | 4/2002 | Gonzalez et al. | |
| 6,420,215 B1 | 7/2002 | Knall et al. | |
| 6,426,891 B1 | 7/2002 | Katori | |
| 6,465,370 B1 | 10/2002 | Schrems | |
| 6,483,734 B1 | 11/2002 | Sharma et al. | |
| 6,534,841 B1 | 3/2003 | Van Brocklin et al. | |
| 6,541,792 B1* | 4/2003 | Tran et al. | 257/50 |
| 6,618,295 B2 | 9/2003 | Scheuerlein | |
| 6,707,698 B2* | 3/2004 | Fricke et al. | 365/105 |
| 6,753,561 B1 | 6/2004 | Rinerson et al. | |
| 6,761,985 B2 | 7/2004 | Windisch et al. | |
| 6,774,458 B2* | 8/2004 | Fricke et al. | 257/530 |
| 6,778,441 B2 | 8/2004 | Forbes et al. | |
| 6,787,401 B2 | 9/2004 | Gonzalez et al. | |
| 6,798,685 B2 | 9/2004 | Rinerson et al. | |
| 6,815,744 B1 | 11/2004 | Beck et al. | |
| 6,831,854 B2 | 12/2004 | Rinerson et al. | |
| 6,834,008 B2 | 12/2004 | Rinerson et al. | |
| 6,836,421 B2 | 12/2004 | Rinerson et al. | |
| 6,850,429 B2 | 2/2005 | Rinerson et al. | |
| 6,850,455 B2 | 2/2005 | Rinerson et al. | |
| 6,856,536 B2 | 2/2005 | Rinerson et al. | |
| 6,859,382 B2 | 2/2005 | Rinerson et al. | |
| 6,870,755 B2 | 3/2005 | Rinerson et al. | |
| 6,879,505 B2 | 4/2005 | Scheuerlein | |
| 6,946,719 B2 | 9/2005 | Petti et al. | |
| 6,952,030 B2 | 10/2005 | Herner et al. | |
| 6,956,278 B2 | 10/2005 | Herner | |
| 7,116,573 B2 | 10/2006 | Sakamoto et al. | |
| 7,172,840 B2 | 2/2007 | Chen et al. | |
| 7,176,064 B2 | 2/2007 | Herner et al. | |
| 7,215,564 B2 | 5/2007 | Happ et al. | |
| 7,224,013 B2 | 5/2007 | Herner et al. | |
| 7,238,607 B2 | 7/2007 | Dunton et al. | |
| 7,265,049 B2 | 9/2007 | Herner et al. | |
| 7,285,464 B2 | 10/2007 | Herner | |
| 7,307,268 B2 | 12/2007 | Scheuerlein | |
| 7,391,064 B1 | 6/2008 | Tripsas et al. | |
| 7,501,331 B2 | 3/2009 | Herner | |
| 7,553,611 B2 | 6/2009 | Chen et al. | |
| 2002/0057594 A1 | 5/2002 | Hirai | |
| 2003/0013007 A1 | 1/2003 | Kaun | |
| 2003/0047727 A1 | 3/2003 | Chiang | |
| 2003/0081446 A1 | 5/2003 | Fricke et al. | |
| 2003/0209971 A1 | 11/2003 | Kozicki | |
| 2004/0002186 A1 | 1/2004 | Vyvoda et al. | |
| 2004/0084743 A1 | 5/2004 | VanBuskirk et al. | |
| 2004/0095300 A1 | 5/2004 | So et al. | |
| 2004/0159828 A1 | 8/2004 | Rinerson et al. | |
| 2004/0159867 A1 | 8/2004 | Kinney et al. | |
| 2004/0159869 A1 | 8/2004 | Rinerson et al. | |
| 2004/0160798 A1 | 8/2004 | Rinerson et al. | |
| 2004/0160804 A1 | 8/2004 | Rinerson et al. | |
| 2004/0160805 A1 | 8/2004 | Rinerson et al. | |
| 2004/0160806 A1 | 8/2004 | Rinerson et al. | |
| 2004/0160807 A1 | 8/2004 | Rinerson et al. | |
| 2004/0160808 A1 | 8/2004 | Rinerson et al. | |
| 2004/0160812 A1 | 8/2004 | Rinerson et al. | |
| 2004/0160817 A1 | 8/2004 | Rinerson et al. | |
| 2004/0160818 A1 | 8/2004 | Rinerson et al. | |
| 2004/0160819 A1 | 8/2004 | Rinerson et al. | |
| 2004/0161888 A1 | 8/2004 | Rinerson et al. | |
| 2004/0170040 A1 | 9/2004 | Rinerson et al. | |
| 2004/0228172 A1 | 11/2004 | Rinerson et al. | |
| 2004/0245557 A1 | 12/2004 | Seo et al. | |
| 2005/0045919 A1 | 3/2005 | Kaeriyama et al. | |
| 2005/0052915 A1 | 3/2005 | Herner | |
| 2005/0058009 A1 | 3/2005 | Yang | |
| 2005/0167699 A1 | 8/2005 | Sugita | |
| 2005/0221200 A1 | 10/2005 | Chen et al. | |
| 2005/0247921 A1 | 11/2005 | Lee et al. | |
| 2005/0286211 A1 | 12/2005 | Pinnow et al. | |
| 2006/0006495 A1 | 1/2006 | Herner et al. | |
| 2006/0067117 A1 | 3/2006 | Petti | |
| 2006/0094236 A1 | 5/2006 | Elkins | |
| 2006/0098472 A1 | 5/2006 | Ahn et al. | |
| 2006/0128153 A1 | 6/2006 | Dunton et al. | |
| 2006/0157679 A1 | 7/2006 | Scheuerlein | |
| 2006/0164880 A1 | 7/2006 | Sakamoto et al. | |
| 2006/0250836 A1 | 11/2006 | Herner et al. | |
| 2006/0250837 A1 | 11/2006 | Herner et al. | |
| 2006/0268594 A1 | 11/2006 | Toda | |
| 2006/0273298 A1 | 12/2006 | Petti | |
| 2007/0010100 A1 | 1/2007 | Raghuram et al. | |
| 2007/0072360 A1 | 3/2007 | Kumar et al. | |
| 2007/0114508 A1 | 5/2007 | Herner et al. | |
| 2007/0114509 A1 | 5/2007 | Herner | |
| 2007/0228414 A1 | 10/2007 | Kumar et al. | |
| 2007/0236981 A1 | 10/2007 | Herner | |
| 2007/0246743 A1 | 10/2007 | Cho et al. | |
| 2008/0175032 A1 | 7/2008 | Tanaka et al. | |
| 2009/0001342 A1 | 1/2009 | Schricker et al. | |
| 2009/0001343 A1 | 1/2009 | Schricker et al. | |
| 2009/0001344 A1 | 1/2009 | Schricker et al. | |
| 2009/0001345 A1 | 1/2009 | Schricker et al. | |
| 2009/0104756 A1 | 4/2009 | Kumar | |
| 2009/0236581 A1 | 9/2009 | Yoshida et al. | |

FOREIGN PATENT DOCUMENTS

| | | |
|---|---|---|
| EP | 1 484 799 A2 | 12/2004 |
| EP | 1 513 159 A2 | 3/2005 |
| EP | 1 914 806 A1 | 4/2008 |
| GB | 1 284 645 | 8/1972 |
| GB | 1 416 644 | 12/1975 |
| GB | 1416644 | 12/1975 |
| JP | 62042582 | 2/1987 |
| WO | WO 97/41606 | 11/1997 |
| WO | WO 00/49659 | 8/2000 |
| WO | WO 01/69655 A2 | 9/2001 |
| WO | WO 03/079463 A2 | 9/2003 |
| WO | WO 2005/024839 A1 | 3/2005 |
| WO | WO 2006/078505 A2 | 7/2006 |
| WO | WO 2006/121837 A2 | 11/2006 |
| WO | WO 2006/121837 A3 | 11/2006 |
| WO | WO 2007/004843 A1 | 1/2007 |
| WO | WO 2007/038709 | 4/2007 |
| WO | WO 2007/062022 A1 | 5/2007 |
| WO | WO 2007/067448 A1 | 6/2007 |
| WO | WO 2007/072308 A1 | 6/2007 |
| WO | WO 2008/097742 | 8/2008 |

OTHER PUBLICATIONS

Baek, I.G., et al., Highly Scalable Non-volatile Resistive Memory Using Simple Binary Oxide Driven by Asymmetric Unipolar Voltage Pulses, IEDM (2004), (Jan. 2004), 587-590.

Beck, et al., "Reproducible Switching Effect in Thin Oxide Films for Memory Applications," Applied Physics Letters, vol. 77, No. 1,Jul. 3, 2000, pp. 139-141, XP00958527, ISSN: 0003-6951.

Bruyere et al., "Switching and Negative Resistance in Thin Films of Nickel Oxide", Applied Physics Letters, vol. 16, No. 1, Jan. 1, 1970, pp. 40-43.

Hiatt et al., "Bistable Switching in Niobium Oxide Diodes," Applied Physics Letters, Mar. 15, 1965, vol. 6, No. 6, pp. 106-108.

Hwang et al., "Molecular dynamics simulations of nanomemory element based on boron-nitride nanotube-to-peapod transition," Computational Materials Science, 2005, pp. 317-324, 33, Elsevier B.V.

Mine, Lili, "ReRAM with Erase/Read Speed of 3ns, Applicable as Multi-Level cell", Dec. 26, 2006. Nikkei Electronics, <http://techon.nikkeibp.co.jp/english/NEWS_EN/20061226/12591&f>; pp. 1-2.

Pagnia, H., et al., "Bistable switching in Electroformed Metal-Insulator-Metal Devices", Phys. Stat. Sol. A 108 11 (1988), (1988), 10-65.

Park, Jae-Wan., et al. "Reproducible resistive switching in nonstoichiometric nickel oxide films grown by rf reactive sputtering for resistive random access memory applications", J. Vac. Sci. Technol. A 23(5). (Sep./Oct. 2005), 1309-1313.

Prince, "Trends in Scaled and Nanotechnology Memories," Sep. 2005, Non-Volatile Memory Symposium, IEEE, Piscataway, NJ USA, pp. 55-61.

Roginskaya et al., "Characterization of Bulk and Surface Composition of CoxNi1-xOy Mixed Oxides for Electrocatalyis", Langmuir, vol. 13, No. 17, 1997, pp. 4621-4627.

Scheuerlein et al., "A 10ns Read and Write Non-Volatile Memory Array Using a Magnetic Tunnel Junction and FET Switch in each Cell," 2000, IEEE International Solid-State Circuits Conference, pp. 1-2.

Seo, S., et al.,"Reproducible resistance switching in polycrystalline NiO films", . Appl. Phys. Lett. vol. 85 No. 23 (2004), (Dec. 6, 2004), 5655-5657.

Seo, S., et al. "Conductivity switching characteristics and reset currents in NiO films", Appl. Phys. Lett. 86 093509 (2005) (2005), 093509;093509-2;093509-3.

Sim et al., "Resistance Switching Characteristics of Polycrystalline Nb2O5 for Nonvolatile Memory Application", IEEE Electron Device Letters vol. 26, Issue 3, pp. 292-294 (2005), published May 2, 2005.

Windisch, et al., "Synthesis and Characterization of Transparent Conducting Oxide Cobalt-Nickel Spinel Films", Journal of Vacuum Science & Technology A, vol. 19, No. 4, Jul. 2001 pp. 1647-1651.

Sep. 6, 2007 International Search Report and Written Opinion of PCT/US2007/007153.

Oct. 9, 2008 International Preliminary Report on Patentability and Written Opinion of International Application No. PCT/US2007/007153.

Jan. 13, 2009 Examination Report of EP 07 753 755.3.

Malhi et al., "Characteristics and Three-Dimensional Integration of MOSFET's in Small-Grain LPCVD Polycrystalline Silicon", Feb. 1985, IEEE Journal of Solid-State Circuits, vol. sc-20, No. 1, pp. 178-201.

Choi et al., "Resistive Switching Mechanism of TiO2 Thin Films Grown by Atomic-Layer Deposition", 2005, Journal of Applied Physics 98, pp. 033715-1-033715-10.

Shih et al., "Study of Anodic Oxidation of Aluminum in Mixed Acid using a Pulsed Current", 2000, Surface and Coatings Technology 124, pp. 278-285.

F C Eze, "Electroless Deposition of CoO Thin Films", J. Phys. D: Appl. Phys. 32 (1999), pp. 533-540.

Milgram, "Selective Surfaces of Anodic Copper Oxide for Solar Collectors" Jun. 1983, J. Appl. Phys. 54 (6), pp. 3640-3642.

Lu et al., "Study of the Electroless Deposition Process of Ni-P-Based Ternary Alloys", 2003, Journal of The Electrochemical Society, 150 (11), pp. C777-C786.

Osaka et al., "Electroless Nickel Ternary Alloy Deposition on SiO2 for Application to Diffusion Barrier Layer in Copper Interconnect Technology", 2002, Journal of The Electrochemical Society, 149 (11), pp. C573-C578.

Han et al., "The Growth Mechanism of Nickel Oxide Thin Films by Room-Temperature Chemical Bath Deposition", 2006, Journal of the Electrochemical Society, 153 (6), pp. C382-C386.

G.P. Burns, "Titanium Dioxide Dielectric Films Formed by Rapid Thermal Oxidation", Mar. 1, 1989, J. Appl. Phys. 65 (5), pp. 2095-2097.

Fujimoto et al., "TiO2 Anatase Nanolayer on TiN Thin Film Exhibiting High-Speed Bipolar Resistive Switching", 2006, Applied Physics Letters 89, pp. 223509-1-223509-3.

Takano et al., "Mechanism of the Chemical Deposition of Nickel on Silicon Wafers in Aqueous Solution", 1999, Journal of The Electrochemical Society, 146 (4), pp. 1407-1411.

Abouatallah et al., "Characterization of Vanadium Deposit Formation at a Hydrogen Evolving Electrode in Alkaline Media", 2001, Journal of the Electrochemical Society, 148 (9), pp. E357-E363.

Christensen et al., "The Influence of Oxide on the Electrodeposition of Niobium from Alkali Fluoride Melts", May 1994, J. Electrochem. Soc., vol. 141, No. 5, pp. 1212-1220.

Lantelme et al., "Electrodeposition of Tantalum in NaCI-KCI-K2TzF7 Melts", May 1992, J. Electrochem. Soc., vol. 139, No. 5, pp. 1249-1255.

Herner et. al., "Vertical p-i-n Polysilicon Diode With Antifuse for Stackable Field-Programmable ROM", May 2004, IEEE Electron Device Letters, vol. 25, No. 5, pp. 271-273.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDM Technical Digest, IEEE International Dec. 5, 2005, Piscataway, NJ, USA, pp. 758-761.

Ansari, et al., "Pre- and Post-Threshold Conduction Mechanisms in Thermally Grown Titanium Oxide Films", J. Phys. D. Appl. Phys. 20, (1987), pp. 1063-1066.

Herner et al., U.S. Appl. No. 10/326,470, filed Dec. 19, 2002.

Office Action of Taiwan Patent Application No. 096110614 mailed Jul. 27, 2010.

\* cited by examiner

NONVOLATILE REWRITABLE MEMORY CELL COMPRISING A RESISTIVITY-SWITCHING OXIDE OR NITRIDE AND AN ANTIFUSE

RELATED APPLICATION

This application is related to Herner et al., U.S. application Ser. No. 11/394,903, "Multilevel Nonvolatile Memory Cell Comprising a Resistivity-Switching Oxide or Nitride and an Antifuse," filed Mar. 31, 2006, hereinafter the '903 application; and to Herner et al., U.S. patent application Ser. No. 11/395,995, "Nonvolatile Memory Cell Comprising a Diode and a Resistance-Switching Material," filed Mar. 31, 2006, hereinafter the '995 application, both assigned to the assignee of the present invention, filed on even date herewith and hereby incorporated by reference in their entirety.

BACKGROUND OF THE INVENTION

The invention relates to a nonvolatile memory cell comprising a resistivity-switching material.

A resistivity-switching material which can be reversibly switched between stable resistivity states can be used in a nonvolatile memory cell. The resistivity state of the resistivity-switching material stores the data state of the cell.

For some resistivity-switching materials, either the low-to-high resistivity or high-to-low resistivity switch, or both, can be difficult to control. It would be advantageous to improve control of such switching.

SUMMARY OF THE PREFERRED EMBODIMENTS

The present invention is defined by the following claims, and nothing in this section should be taken as a limitation on those claims. In general, the invention is directed to a nonvolatile memory cell comprising a resistivity-switching material.

A first aspect of the invention provides for a nonvolatile memory cell comprising: a resistance-switching element comprising a layer of a resistivity-switching metal oxide or nitride compound, the metal oxide or nitride compound including only one metal; and a dielectric rupture antifuse.

A preferred embodiment of the invention provides for a nonvolatile memory array comprising a first plurality of memory cells, each memory cell of the first plurality comprising: a dielectric rupture antifuse; a resistance-switching memory element comprising a layer of a resistivity-switching metal oxide or nitride compound, the metal oxide or nitride compound including only one metal.

Another aspect of the invention provides for a method for forming and programming a nonvolatile memory cell, the method comprising: forming a dielectric rupture antifuse; and forming a layer of a resistivity-switching metal oxide or nitride compound, the metal oxide or nitride compound including only one metal, wherein the dielectric rupture antifuse and the resistance-switching element are arranged electrically in series in the nonvolatile memory cell; and, after fabrication of the memory cell is complete, applying a preconditioning pulse, wherein the preconditioning pulse serves to rupture the dielectric rupture antifuse, forming a low-resistance rupture region through the dielectric rupture antifuse, and wherein the preconditioning pulse serves to form a resistivity-switching region in the layer of resistivity-switching metal oxide or nitride compound, changing the resistivity state of the resistivity-switching region.

Another preferred embodiment of the invention provides for a monolithic three dimensional memory array comprising: i) a first memory level monolithically formed above a substrate, the first memory level comprising: a) a plurality of substantially parallel, substantially coplanar first conductors; b) a plurality of substantially parallel, substantially coplanar second conductors above the first conductors; and c) a first plurality of memory cells, each memory cell comprising a dielectric rupture antifuse, a portion of one of the bottom conductors, and a portion of one of the top conductors, a layer of a resistivity-switching metal oxide or nitride compound, wherein the metal oxide or nitride compound includes only one metal, and wherein the dielectric rupture antifuse and the layer of resistivity-switching metal oxide or nitride are arranged electrically in series between the portion of the top conductor and the portion of the bottom conductor, and ii) a second memory level monolithically formed above the first memory level.

Still another aspect of the invention provides for a method for programming a nonvolatile memory cell, wherein the cell comprises a dielectric rupture antifuse and a resistance-switching memory element, the resistance-switching memory element comprising a layer of a resistivity-switching metal oxide or nitride compound, the metal oxide or nitride compound including only one metal, the method comprising: applying a preconditioning pulse, wherein the preconditioning pulse serves to rupture the dielectric rupture antifuse, forming a low-resistance rupture region through the dielectric rupture antifuse, and wherein the preconditioning pulse serves to form a switching region in the layer of resistivity-switching metal oxide or nitride compound, putting the switching region in a low-resistivity set state.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
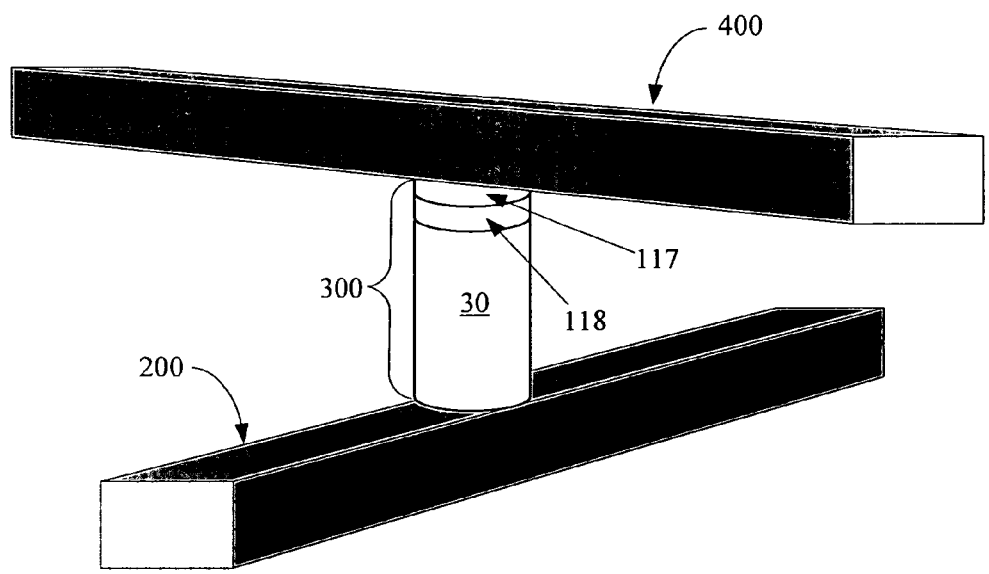
FIG. 1 is a perspective view of a nonvolatile memory cell formed according to a preferred embodiment of the present invention.

A nonvolatile memory cell including a resistivity-switching layer of a metal oxide or nitride compound, the metal oxide or nitride compound including one metal, has been disclosed in Herner et al., U.S. patent application Ser. No. 11/125,939, "Rewriteable Memory Cell Comprising a Diode and a Resistance-Switching Material," filed May 9, 2005, hereinafter the '939 application and hereby incorporated by reference; and in Herner et al., U.S. patent application Ser. No. 11/395,995, "Nonvolatile Memory Cell Comprising a Diode and a Resistance-Switching Material," filed Mar. 31, 2006, the '995 application filed on even date herewith. In preferred embodiments, the resistivity-switching layer is arranged in series with a diode. In both of these applications, a data state of the memory cell is stored in the resistivity state of the resistivity-switching layer; i.e. a memory cell having its resistivity-switching layer in a low-resistivity state may correspond to a data '0', while a memory cell having its resistivity-switching layer in a high-resistivity state may correspond to a data '1'.

The resistivity-switching material is a layer of a metal oxide or nitride compound, the metal oxide or nitride compound including exactly one metal. Preferred metal oxide or nitride compounds include $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, where x and y range between 0 and 1. Examples are the stoichiometric compounds NiO, $Nb_2O_5$, $TiO_2$, $HfO_2$, $Al_2O_2$, MgO, CoO, $CrO_2$, VO, ZnO, ZrO, BN, and AlN, but nonstoichiometric compounds may be used as well. A layer of one of these materials is formed in an initial stable resistivity state, for example a high-resistivity state. That initial resistivity state can be changed to a different stable resistivity state by application of an appropriate electrical pulse. A pulse that changes the resistivity-switching layer from a higher-resistivity reset state to a lower-resistivity set state is a set pulse, while a pulse that changes the resistivity-switching layer from a lower-resistivity state to a higher-resistivity state is a reset pulse. Where appropriate, this description will also speak of a set voltage, set current, reset voltage, or reset current.

In the present invention, a dielectric rupture antifuse is included in series with the resistivity-switching layer. The dielectric rupture antifuse is formed in an initial non-conductive state, impeding current flow. Upon application of a programming pulse, the dielectric material of the antifuse suffers dielectric breakdown, altering the dielectric rupture antifuse permanently and causing it to become conductive, permitting increased current flow. In preferred embodiments, a diode is also formed in series with the dielectric rupture antifuse and the resistivity-switching layer.

In the present invention, dielectric rupture of the antifuse takes place only in a small conductive rupture region. Current is crowded through this rupture region, and this current crowding serves to focus current through a narrow switching path through the resistivity-switching layer, making switching the resistivity of this layer more controllable. The dielectric rupture antifuse is ruptured in every cell in a preconditioning step, preferably in the factory, to make the memory ready for use.

FIG. 1 shows a memory cell according to a preferred embodiment of the present invention. A pillar 300 includes a vertically oriented diode 30, a resistivity-switching layer 118, and a dielectric rupture antifuse 117, disposed in series between a bottom conductor 200 and a top conductor 400. Most embodiments will include additional layers, serving as barrier layers, adhesion layers, etc., as will be described.

FIG. 1 is one example of a nonvolatile memory cell comprising: a resistance-switching element comprising a layer of a resistivity-switching metal oxide or nitride compound, the metal oxide or nitride compound including only one metal; and a dielectric rupture antifuse. A diode may also be included, the antifuse, resistance-switching element, and antifuse arranged electrically in series. These elements may be disposed between a top and a bottom conductor.

In preferred embodiments, the diode is a semiconductor junction diode. A semiconductor junction diode is a semiconductor device with the property of conducting current more easily in one direction than the other, having two terminal electrodes, and made of semiconducting material which is p-type at one electrode and n-type at the other. Examples are p-n diodes, p-i-n diodes, and Zener diodes. In alternative embodiments, the diode can be a Schottky barrier diode, or a diode of metal oxides having semiconductor properties, for example with NiO serving as a p-type region and a $TiO_2$ serving as the n-type region.

Figure 2:
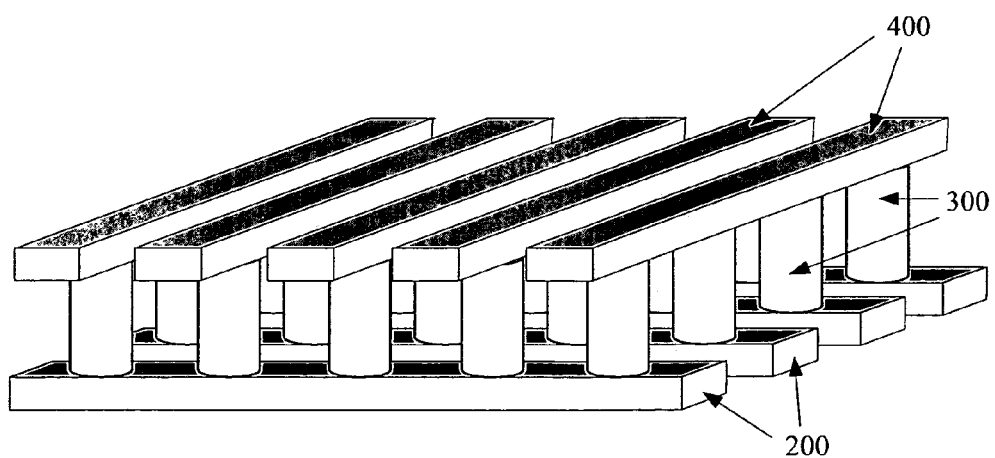
FIG. 2 is a perspective view of a portion of a memory level comprising a plurality of the memory cells of FIG. 1.

FIG. 2 shows a memory level of such memory cells, which can be formed by forming a plurality of substantially coplanar bottom conductors 200, pillars 300, and top conductors 400. This memory level can be formed of deposited layers above a substrate, for example a semiconductor wafer substrate, such as a monocrystalline silicon wafer or a silicon-on-insulator wafer.

Two, three, four or more such memory levels can be stacked to form a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Monolithic three dimensional memory arrays are described in Johnson et al., U.S. Pat. No. 6,034,882, "Vertically stacked field programmable nonvolatile memory and method of fabrication"; in Knall et al., U.S. Pat. No. 6,420,215, "Three Dimensional Memory Array and Method of Fabrication"; and in Herner et al., U.S. Pat. No. 6,952,030, "High-density three-dimensional memory cell," all hereby incorporated by reference.

As described earlier, preferred materials for the resistivity-switching layer include $Ni_xO_y$, $Nb_xO_y$, $Ti_xO_y$, $Hf_xO_y$, $Al_xO_y$, $Mg_xO_y$, $Co_xO_y$, $V_xO_y$, $Zn_xO_y$, $Zr_xO_y$, $B_xN_y$, and $Al_xN_y$. For simplicity, this discussion will describe a memory cell formed using nickel oxide as the resistivity-switching metal oxide or nitride compound. It will be understood that any of the other named materials could be used instead. It will further be understood that in this discussion "nickel oxide" refers to both stoichiometric and nonstoichiometric oxides of nickel.

Figure 3:
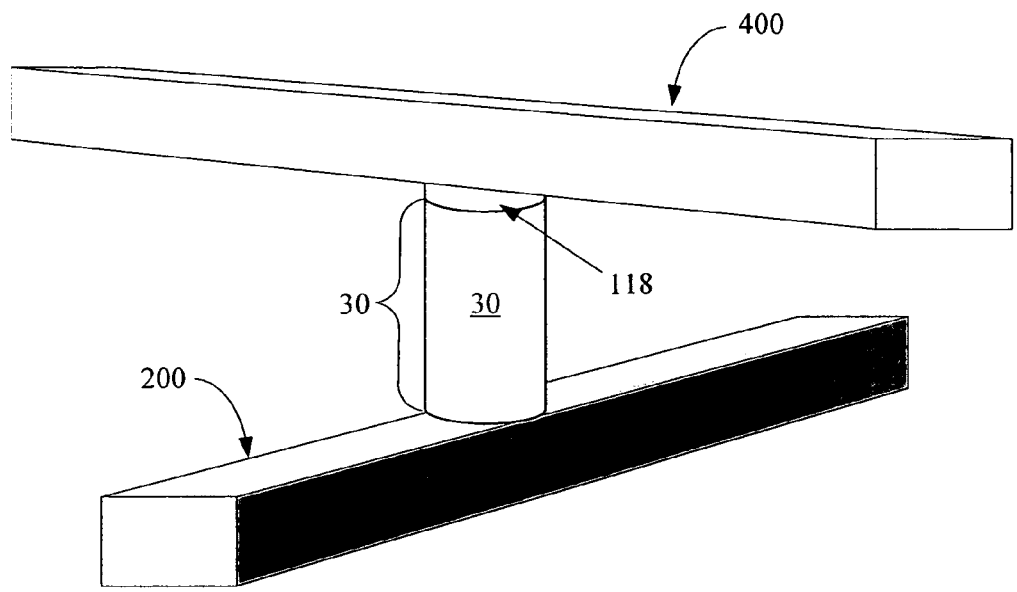
FIG. 3 is a perspective view of a memory cell according to the '939 application.

In general, a layer of nickel oxide is formed in a high-resistivity state. Upon application of a set pulse, the nickel oxide converts to a low-resistivity state. Turning to FIG. 3, in a memory cell with no dielectric rupture antifuse, when a set voltage is applied between top conductor 400 and bottom conductor 200 and current flows through diode 30, nickel oxide layer 118 is converted from its initial high-resistivity state to a lower-resistivity state. Such a memory cell is described in the '939 application.

The set and reset pulses require careful control. The switch from the set state back to the higher-resistivity reset state requires that a reset voltage be built up across the resistivity-switching layer. Referring to FIG. 3, if the set state of nickel oxide layer 118 is very low-resistivity, allowing high current flow, it may become very difficult to build up sufficient voltage to cause nickel oxide layer 118 to reset back to a higher-resistivity state.

Figure 4:
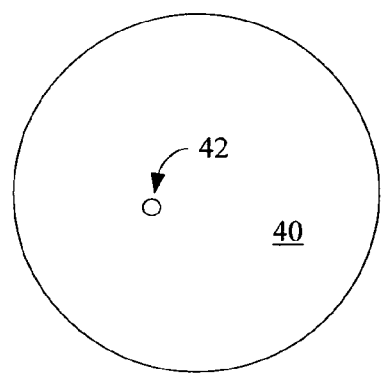
FIG. 4 is a plan view of a dielectric rupture antifuse having a small conductive rupture region formed therethrough.

Referring to FIG. 1, in the present invention, dielectric rupture antifuse 117 is formed of dielectric material; for example this antifuse may be a single layer of grown or deposited silicon dioxide or some other grown or deposited dielectric. Application of a voltage sufficient to cause dielectric breakdown forms a low-resistance rupture region through the antifuse. Referring to FIG. 4, the area of this rupture region 42 is much smaller than that of the antifuse 40 itself; it may have a diameter of, for example, about 2-5 nm.

Referring to FIG. 1, when the dielectric rupture antifuse 117 is adjacent to nickel oxide layer 118, the current flow is focused through the very narrow rupture region, forming a comparably narrow switching region through nickel oxide layer 118. A thin conductive barrier layer (not shown) may intervene between the nickel oxide layer and the antifuse. If the barrier layer is sufficiently thin (preferably thinner than the resistivity-switching layer) and of relatively high-resistivity material (preferably of resistivity comparable to the high-resistivity state of the resistivity-switching material), the effect of current crowding will be transmitted through the barrier layer.

This current crowding creates a higher observed resistance though the narrow switching region. The higher resistance of this switching region in resistivity-switching layer 118 helps to control the set and reset states. Compared to a similar cell without antifuse layer 117, in the present invention the current path is higher-resistance at the same voltage, allowing for lower current, thus allowing for lower power. The resistivity state of the resistivity-switching layer can readily be set and reset, making for a robust rewriteable memory cell.

To deliver maximum power to a cell, the resistance of the programmed cell during programming should be about the same as the sum of the resistance of the circuits driving the wordline and bitline of the selected cell. When a low-resistance rupture region is electrically formed by dielectric breakdown across the dielectric layer, the dielectric region is originally high resistance, then drops in resistance as the rupture region forms. As the resistance of the rupture region approaches that of the circuit, the rupture region begins to cool, and will not further increase in size. Thus the formation mechanism of the rupture region tends to cause the rupture region to have about the same resistance as the resistance of the driving circuit. In subsequent programming events, then, the rupture region provides a means to deliver predictable levels of power to the cell. Conventional current limiter circuitry may advantageously be used to control the effective resistance of drivers during programming, as will be well understood by those skilled in the art.

In a memory in which feature size ranges from about 0.1 micron down to about 10 nm (as in most preferred embodiments of the present invention), the initial resistance of the unruptured antifuse will be very high, between about 10 megaOhm and about 1000 megaOhm. After dielectric breakdown, the resistance of the rupture region will be between about 10 kiloOhms and about 1 megaOhm.

The present invention allows improved control over set and reset states; thus in some embodiments it will be possible for the nickel oxide (or other resistivity-switching material) to repeatably achieve more than two stable resistivity states which are readily detectable. Advantageous methods to set and reset to multiple resistivity levels are described in the '995 application, filed on even date herewith.

Circuit structures and methods suitable for use in three dimensional memory arrays formed according to the present invention are described in Scheuerlein, U.S. patent application Ser. No. 10/403,844, "Word Line Arrangement Having Multi-Layer Word Line Segments for Three-Dimensional Memory Array," filed Mar. 31, 2003, which is assigned to the assignee of the present invention and is hereby incorporated by reference. Beneficial elements of this arrangement include use of a common word line driver and very long bitlines allowing reduction in overhead circuitry.

Scheuerlein, U.S. patent application Ser. No. 11/040,262, "Structure and Method for Biasing Phase Change Memory Array for Reliable Writing," teaches a biasing scheme that could advantageously be used in an array formed according to the present invention. The biasing scheme of this application guarantees that the voltage across unselected and half-selected cells is not sufficient to cause inadvertent conversion of those cells, and allows precise control of the power delivered to the cell to be programmed. Further useful teachings are found in Scheuerlein, U.S. Pat. No. 6,618,295, "Method and Apparatus for Biasing Selected and Unselected Array Lines When Writing a Memory Array."

Figure 5A:
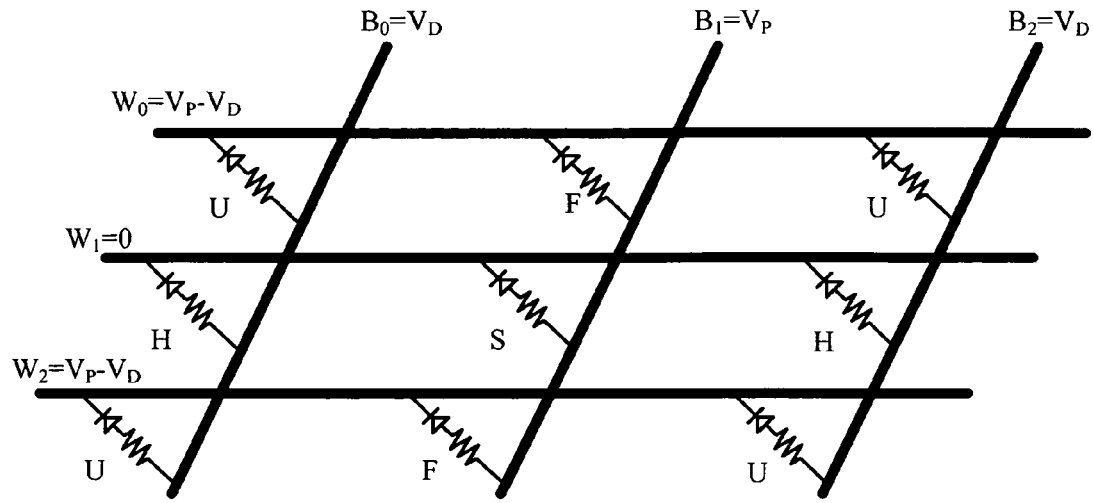
FIGS. 5a-5d are circuit diagrams illustrating biasing schemes to precondition, reset, set, and read the selected memory cell S without disturbing adjacent half-selected cells H and F and unselected cells U.

Recall that a preconditioning pulse is applied to every antifuse in the memory array to create the rupture region to make the device ready for use as a memory cell. FIG. 5a illustrates an advantageous biasing scheme to rupture the antifuse of a selected cell in a preconditioning step to be performed on every cell. Those skilled in the art will understand that the voltages supplied in this and the following examples may be varied depending on many details of cell construction.

Referring to FIGS. 1 and 5a-5d, in a preferred embodiment the diode 30 has p-type material adjacent to switching material 118 and antifuse layer 117, and n-type material adjacent to bottom conductor 200, which is the wordline. The memory cell of FIG. 1 can be formed in a memory array (as shown in FIG. 2), so wordline 200 is one of many wordlines, and top conductor 400, which is the bitline, is one of many bitlines. It will further be understood that, for simplicity, antifuses are not depicted in FIGS. 5a-5d.

Referring to FIG. 5a, the cell to undergo antifuse rupture is selected cell S at the intersection of selected worldline $W_1$ and selected bitline $B_1$. In this example bitline $B_1$ is set to a relatively high preconditioning voltage $V_P$, for example 10 v, while wordline $W_1$ is set to ground. This voltage across memory cell S is sufficient to rupture the antifuse, convert the high-resistivity polysilicon of the diode to a low-resistivity state, and put the nickel oxide resistivity-switching layer into the low-resistivity set state. To avoid disturbing the memory states of neighboring cells, unselected wordlines $W_0$ and $W_2$ are set to $V_P$-$V_D$ volts, where $V_D$ is the turn-on voltage of the diode. A diode permits little or no current flow below its turn-on voltage, and permits much higher current flow above the turn-on voltage. All unselected bitlines, such as bitlines $B_0$ and $B_2$, are set to $V_D$. Thus half selected cells H sharing wordline $W_1$ with selected cell S are subjected to a positive voltage of $V_D$. Half selected cell F sharing bitline B1 with selected cell S are subjected to a positive voltage of $V_P$-$(V_P-V_D)$=$V_D$. Unselected cells U sharing neither wordline $W_1$ or bitline $B_1$ with selected cell S are subjected to a voltage of $V_D$-$(V_P-V_D)$ or a negative voltage of $V_P$-$2V_D$.

For example, suppose $V_P$ is 10 volts and $V_D$ is 0.8 volts. Unselected wordlines $W_0$ and $W_2$ are set to 9.2 volts, and unselected bitlines $B_0$ and $B_2$ are set to 0.8 volts. Selected cell S sees 10 volts, half-selected cells H and F are subjected to 0.8 volts, while unselected cells U are subjected to a voltage of −8.4 volts.

Figure 5B:
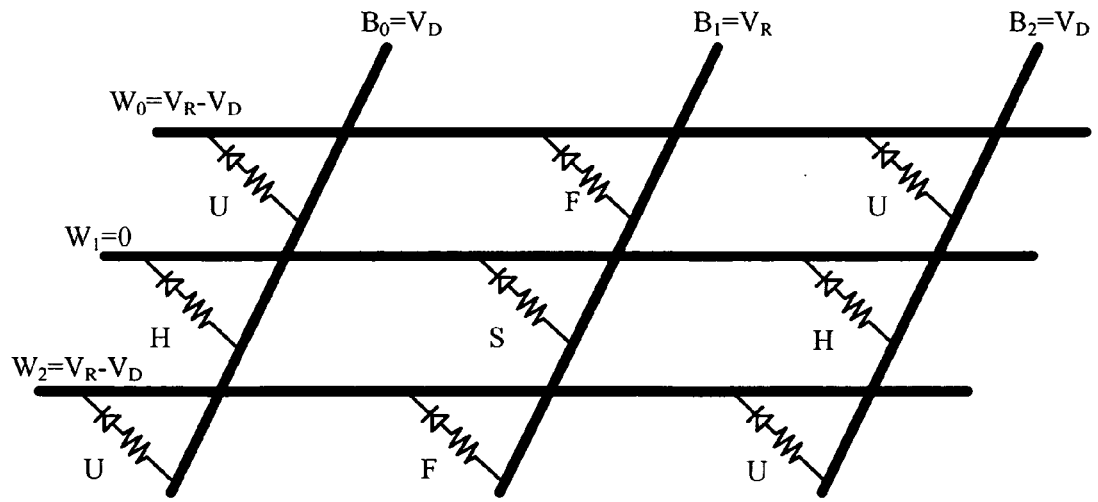

Turning to FIG. 5b, to reset the resistivity-switching layer after the antifuse has been ruptured, selected bitline $B_1$ is set to the reset voltage $V_R$, for example between about 2 and about 4 volts. Selected wordline $W_1$ is again at ground, for a voltage of $V_R$ volts across selected cell S. Unselected wordlines $W_0$ and $W_2$ are set to $V_R$-$V_D$, and unselected bitlines $B_0$ and $B_2$ are set to $V_D$. Thus selected cell S is subjected to $V_R$, half selected cells H and F are subjected to a voltage of $V_D$, while a voltage of $V_D$-$(V_R$-$V_D)$ is applied to unselected cells U.

For example, suppose $V_R$ is 3 volts and $V_D$ is 0.8 volts. Selected bitline $B_1$ is at 3 volts and selected wordline $W_0$ is at ground. Unselected wordlines $W_0$ and $W_2$ are at 2.2 volts, while unselected bitlines $B_0$ and $B_2$ are at 0.8 volts. Thus the voltage across selected cell S is 3 volts, across half-selected cells H and F is 0.8 volts, and across unselected cells U is −1.4 v.

Figure 5C:
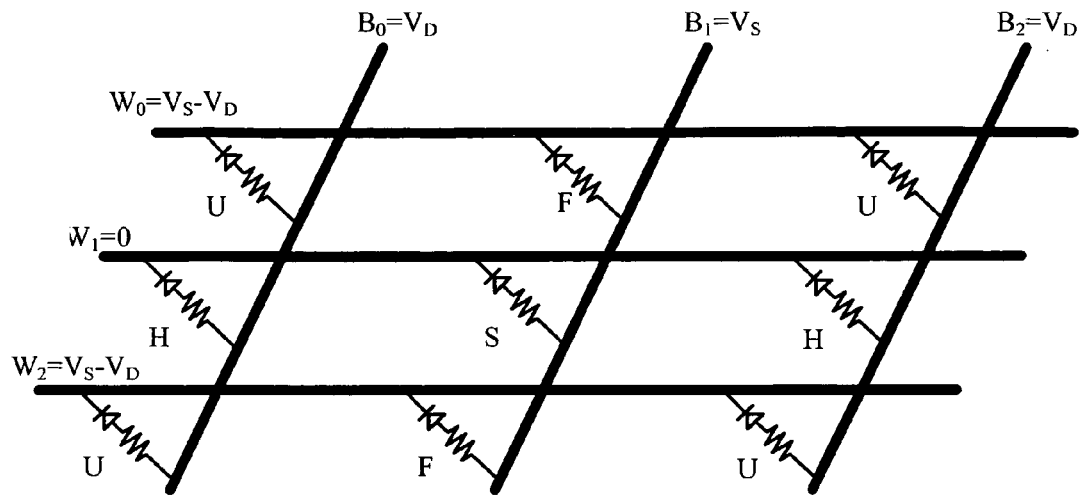

Turning to FIG. 5c, in subsequent set operations, to set the resistivity-switching layer, selected bitline $B_1$ is set to the set voltage $V_S$, for example between about 4.1 and about 7 volts. Selected wordline $W_1$ is again at ground, for a voltage of $V_S$ volts across selected cell S. Unselected wordlines $W_0$ and $W_2$ are set to $V_S$-$V_D$, and unselected bitlines $B_0$ and $B_2$ are set to $V_D$. Thus the voltage across selected cell S is $V_S$, half selected cells H and F are subjected to a voltage of $V_D$, while a voltage of $V_D$-$(V_S$-$V_D)$ is applied to unselected cells U.

For example, suppose $V_S$ is 6 volts and $V_D$ is 0.8 volts. Selected bitline $B_1$ is at 6 volts and selected wordline $W_1$ is at ground. Unselected wordlines $W_0$ and $W_2$ are at 5.2 volts, while unselected bitlines $B_0$ and $B_2$ are at 0.8 volts. Thus the voltage across selected cell S is 6 volts, across half-selected cells H and F is 0.8 volts, and across unselected cells U is −4.4 volts.

Figure 5D:
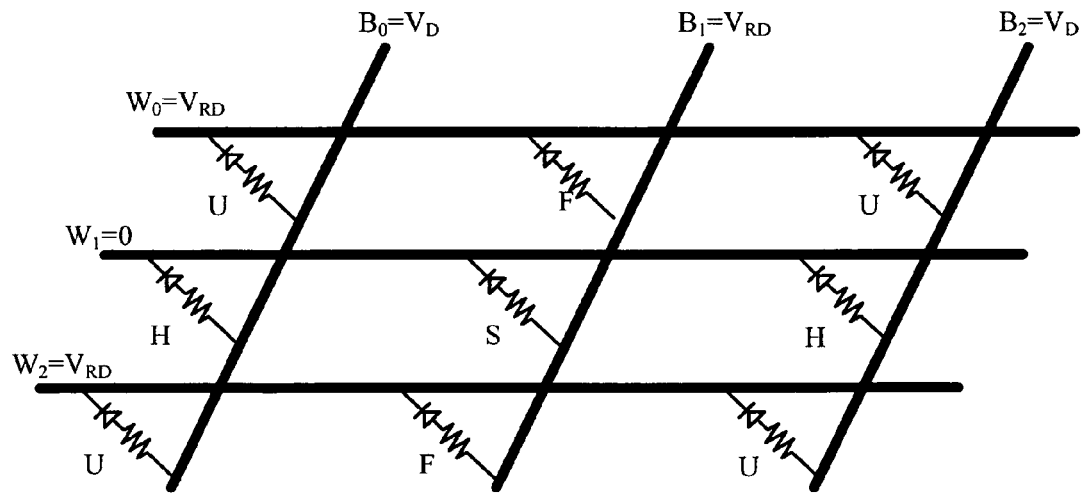

Referring to FIG. 5d, to read selected cell S, a read voltage, $V_{RD}$, should be applied across it. Read voltage $V_{RD}$ is, for example, between about 1.5 and about 1.9 volts. Selected bitline $B_1$ is set to $V_{RD}$, while selected wordline $W_1$ is again at ground, for a voltage of $V_{RD}$ volts across selected cell S. Unselected wordlines $W_0$ and $W_2$ are set to $V_{RD}$, and unselected bitlines $B_0$ and $B_2$ are set to $V_D$. Thus half selected cells H are subjected to a voltage of $V_D$, while a voltage of $V_D$-$V_{RD}$ is applied to unselected cells U. Half-selected cells F are subjected to approximately zero bias to ensure accurate sensing of selected cell S.

For example, suppose $V_{RD}$ is 1.8 volts and $V_D$ is 0.8 volts. Selected bitline $B_1$ is at 1.8 volts and selected wordline $W_1$ is at ground. Unselected wordlines $W_0$ and $W_2$ are at 1.8 volts, while unselected bitlines $B_0$ and $B_2$ are at 0.8 volts. Thus the voltage across selected cell S is 1.8 volts, across half-selected cells H is 0.8 volts, across unselected cells U is −1.0 volts, and across half-selected cells F is approximately zero volts.

To summarize, to program the memory cell, after fabrication of the memory cell is complete, a preconditioning pulse is applied, wherein the preconditioning pulse serves to rupture the dielectric rupture antifuse, forming a low-resistance rupture region through the dielectric rupture antifuse, and wherein the preconditioning pulse serves to form a resistivity-switching region in the layer of resistivity-switching metal oxide or nitride compound, changing the resistivity state of the resistivity-switching region. After the preconditioning pulse, the switching region is in a low-resistivity state, and next a first reset pulse is applied to put the switching region in a high-resistivity reset state.

The cell can be further programmed: After the first reset pulse, a first programming set pulse may be applied to put the switching region in a programmed set state wherein a first data state of the memory cell is stored in a resistivity state of the switching region. The cell can also be programmed with new values, or erased: After the first programming set pulse, a first programming reset pulse can be applied to put the switching region in a programmed reset state, wherein a second data state of the memory cell is stored in the resistivity state of the switching region, and so forth.

With no antifuse layer included in the memory cell, it has been found that reset of nickel oxide layer 118 can be difficult to achieve with a positive voltage; i.e. with forward bias across the diode. If the resistivity of nickel oxide layer 118 is too low in the set state, then current flows too readily through nickel oxide layer 118 to allow sufficient voltage to build up to effect reset. In some embodiments, switching has been achieved more readily with the diode in negative bias. With an antifuse layer 117, however, and with resistivity-switching taking place only in a narrow switching of nickel oxide layer 118, current through nickel oxide layer is limited, aiding reset. It is expected that, in the present invention, reset will be readily achievable with the diode under forward bias.

Thus each cell can be programmed to a different memory state. For example, an array formed according the present invention may comprise a first memory cell wherein a first dielectric rupture antifuse of the first memory cell is ruptured, and wherein a first resistance-switching memory element of the first memory cell is in a low-resistance state; and a second memory cell wherein a second dielectric rupture antifuse of the second memory cell is ruptured, and wherein a second resistance-switching memory element of the second memory cell is in a high-resistance state. The second memory element may have a resistance at least three times higher than a resistance of the first memory element.

As noted, the increased degree of control afforded by the antifuse makes it easier for more than two data states to be achieved. Thus an array formed according to the present invention may include a first memory cell wherein a first dielectric rupture antifuse of the first memory cell is ruptured and wherein a first resistance-switching memory element of the first memory cell is in a first resistance state; a second memory cell wherein a second dielectric rupture antifuse of the second memory cell is ruptured and wherein a second resistance-switching memory element of the second memory cell is in a second resistance state different from the first resistance state; and a third memory cell wherein a third dielectric rupture antifuse of the third memory cell is ruptured and wherein a third resistance-switching memory element of the third memory cell is in a third resistance state different from the first resistance state and the second resistance state, wherein the first, second, and third resistance states are detectably different and correspond to first, second, and third data states.

A detailed example of an advantageous method of forming a preferred memory cell according to an embodiment of the present invention will be provided. This example is provided for clarity and completeness, but is not intended to be limiting, and it will be understood by those skilled in the art that structures and devices falling within the scope of the invention may be formed using many other methods.

An advantageous method for making a dense nonvolatile one-time programmable memory array which is readily manufacturable is taught in Herner et al., U.S. application Ser. No. 10/326,470, hereinafter the '470 application, since abandoned, and hereby incorporated by reference. Related memory arrays, and their use and methods of manufacture, are taught in Herner et al., U.S. patent application Ser. No. 10/955,549, "Nonvolatile Memory Cell Without a Dielectric Antifuse Having High- and Low-Impedance States," filed Sep. 29, 2004 and hereinafter the '549 application; and in Herner et al., U.S. patent application Ser. No. 11/015,824, "Nonvolatile Memory Cell Comprising a Reduced Height Vertical Diode," filed Dec. 17, 2004, and hereinafter the '824 application; all hereby incorporated by reference. Methods taught in these incorporated applications will be useful in fabricating a memory array according to the present invention. To avoid obscuring the invention, many details from the incorporated patents and applications will be omitted. It will be understood, however, that no teaching from these patents and applications is intended to be excluded.

Fabrication

A detailed example will be provided of fabrication of a monolithic three dimensional memory array formed according to a preferred embodiment of the present invention. For clarity many details, including steps, materials, and process conditions, will be included. It will be understood that this example is non-limiting, and that these details can be modified, omitted, or augmented while the results fall within the scope of the invention.

Figure 6A:
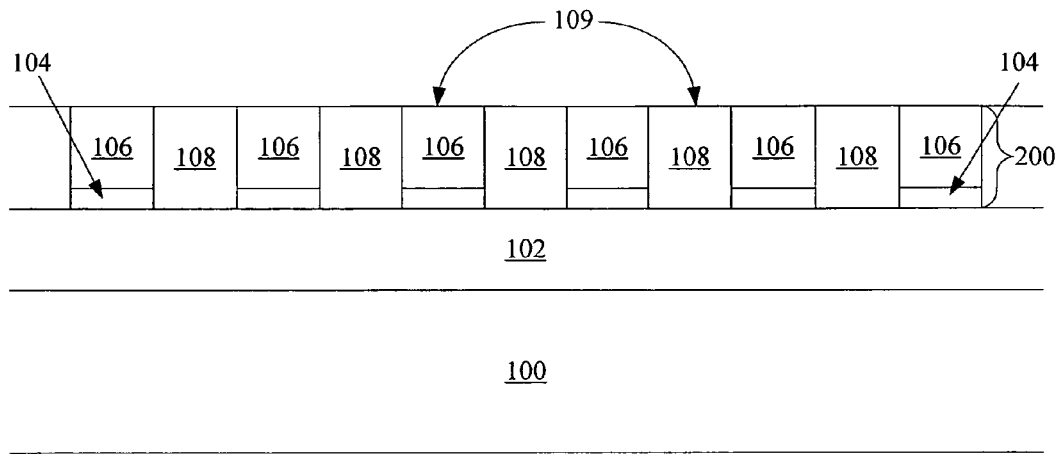
FIGS. 6a-6d are cross-sectional views illustrating stages in formation of a memory level in a monolithic three dimensional memory array formed according to a preferred embodiment of the present invention.

Turning to FIG. 6a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106. A preferred material for the adhesion layer 104 is titanium nitride, though other materials may be used, or this layer may be omitted. Adhesion layer 104 can be deposited by any conventional method, for example by sputtering.

The thickness of adhesion layer 104 can range from about 20 to about 500 angstroms, and is preferably between about 100 and about 400 angstroms, most preferably about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, such as doped semiconductor, metals such as tungsten, or conductive metal silicides; in a preferred embodiment, conducting layer 106 is tungsten.

Once all the layers that will form the conductor rails have been deposited, the layers will be patterned and etched using any suitable masking and etching process to form substantially parallel, substantially coplanar conductors 200, shown in FIG. 6a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 6a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883417, "Nonselective Unpatterned Etchback to Expose Buried Patterned Features," filed Jun. 30, 2004 and hereby incorporated by reference in its entirety, can advantageously be used.

Alternatively, conductor rails can be formed by a damascene process, in which oxide is deposited, trenches are etched in the oxide, then the trenches are filled with conductive material to create the conductor rails.

Figure 6B:
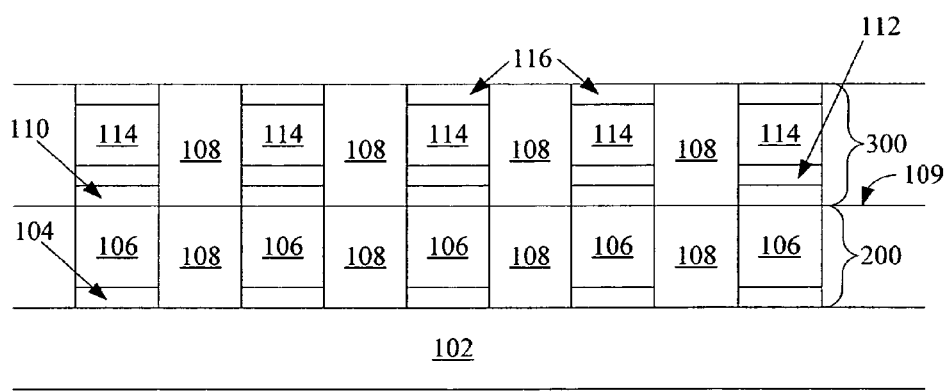

Next, turning to FIG. 6b, vertical pillars will be formed above completed conductor rails 200. (To save space substrate 100 is omitted in FIG. 6b and subsequent figures; its presence will be assumed.) In preferred embodiments a barrier layer 110, preferably of titanium nitride, is deposited on planar surface 109 to prevent tungsten of conductive layer 106 from contacting silicon in the diode to be deposited and subsequent formation of tungsten silicide, which may damage the diode.

Semiconductor material that will be patterned into pillars is deposited. The semiconductor material can be, for example, silicon, germanium, or alloys of silicon and/or germanium. Alternatively, semiconductor metal oxides, such as nickel oxide as a p-type semiconductor or titanium oxide as an n-type semiconductor, may be used. The present example will describe the use of silicon, though it will be understood that other materials may be used instead.

In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type.

In this example, bottom heavily doped region 112 is heavily doped n-type silicon. In a most preferred embodiment, heavily doped region 112 is deposited and doped with an n-type dopant such as phosphorus by any conventional method, preferably by in situ doping. This layer is preferably between about 200 and about 800 angstroms.

Next the silicon that will form the remainder of the diode is deposited. In some embodiments a subsequent planarization step will remove some silicon, so an extra thickness is deposited. If the planarization step is performed using a conventional CMP method, about 800 angstroms of thickness may be lost (this is an average; the amount varies across the wafer. Depending on the slurry and methods used during CMP, the silicon loss may be more or less.) If the planarization step is performed by an etchback method, only about 400 angstroms of silicon or less may be removed. Depending on the planarization method to be used and the desired final thickness, between about 800 and about 4000 angstroms of undoped silicon is deposited by any conventional method; preferably between about 1500 and about 2500 angstroms; most preferably between about 1800 and about 2200 angstroms. If desired, the silicon can be lightly doped.

The silicon just deposited will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between pillars 300, filling the gaps between them. Dielectric material 108 can be any known electrically insulating material, such as silicon dioxide.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used.

In preferred embodiments, heavily doped top regions 116 are formed at this point by ion implantation with a p-type dopant, for example boron or $BF_2$. The resulting structure is shown in FIG. 6b. The diode described herein has a bottom n-type region 112 and a top p-type region 116. If preferred, the conductivity types could be reversed. If desired, p-i-n diodes having an n-region on the bottom could be used in one memory level while p-i-n diodes having a p-type region on the bottom could be used in another memory level.

To summarize, the diode is formed by a method comprising depositing a semiconductor layerstack of silicon, germanium, or an alloy of silicon or germanium; and patterning and etching the layerstack to form a vertically oriented pillar. Gaps between the diodes are filled with dielectric and dielectric overfill removed.

Figure 6C:
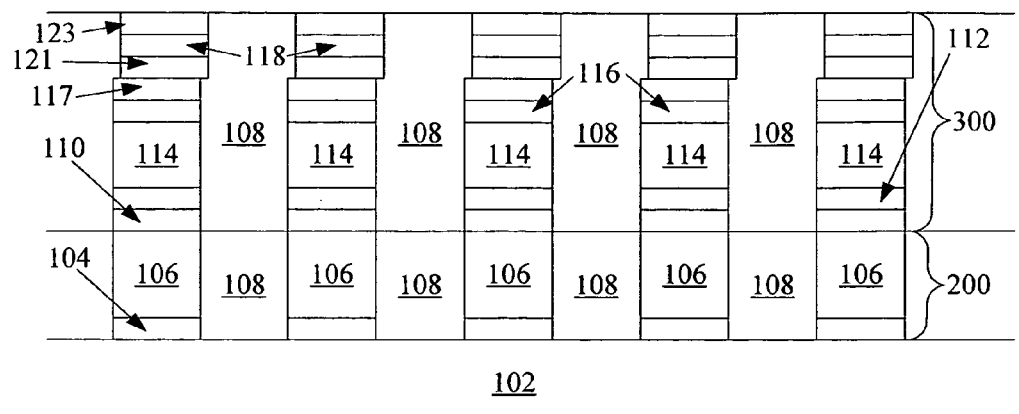

Referring to FIG. 6c, a dielectric rupture antifuse 117 is formed next. In preferred embodiments, antifuse 117 is a layer of a dielectric material such as silicon oxide, silicon nitride, or silicon oxynitride, preferably silicon dioxide. A silicon dioxide layer can be grown by oxidation of silicon layer 116, for example. In general, an oxide which is grown (by oxidation, for example, by consuming some silicon from the underlying layer) rather than deposited will be denser, and have fewer defects, and be higher quality than a comparable deposited dielectric. In some embodiments, dielectrics having a high K value, such as $Si_3N_4$ or $Al_2O_3$, may be preferred.

Next an optional layer 121 of a conductive barrier material, for example titanium nitride, a metal, or some other appropriate material, may be deposited. The thickness of layer 121 may be between about 25 and about 200 angstroms, preferably about 50 angstroms. In a preferred embodiment, layer 121 is a high-resistivity, low-density titanium nitride formed by ionized metal plasma deposition of titanium nitride with no applied self-bias, as described in Herner, U.S. Pat. No. 6,956,278, "Low-Density, High-Resistivity Titanium Nitride Layer for Use as a Contact for Low-Leakage Dielectric Layers," filed Jun. 30, 2003, and hereby incorporated by reference. For example, this titanium nitride may have a resistivity greater than about 300 microOhm-cms and a density less than about 4.25 grams per cubic cm. In some embodiments, layer 121 may be omitted.

A layer 118 of a metal oxide or nitride resistance-switching material is deposited on barrier layer 121, or if barrier layer 121 was omitted, this layer is deposited directly on antifuse 117. Layer 118 is preferably between about 50 and about 400 angstroms thick. Layer 118 can be any of the materials described earlier, and is preferably formed of a metal oxide or nitride having including exactly one metal which exhibits resistance switching behavior; preferably a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$. For simplicity this discussion will describe the use of nickel oxide in layer 118. It will be understood, however, that any of the other materials described can be used.

As described in Herner et al., U.S. patent application Ser. No. 11/287,452, "Reversible Resistivity-Switching Metal Oxide or Nitride Layer with added Metal," filed Nov. 23, 2005, and hereby incorporated by reference, adding a metal to the resistivity-switching metal oxide or nitride compound has been effective in reducing the set and reset voltages required to switch a resistivity-switching layer of the metal oxide or nitride compound between stable resistivity states. In some embodiments, a metal may be added to the metal oxide or nitride compound of layer 118. Preferred metals include cobalt, aluminum, gallium, indium, nickel, niobium, zirconium, titanium, hafnium, tantalum, magnesium, chromium, vanadium, boron, yttrium, and lanthanum. Preferably the metal additive is between about 0.01 and about 5 percent of the metal atoms in the layer of metal oxide or nitride compound.

Finally in preferred embodiments barrier layer 123 is deposited on nickel oxide layer 118. Layer 123 is preferably titanium nitride, though some other appropriate conductive barrier material may be used instead. In some embodiments, layer 123 may be omitted.

Layers 123, 118, and 121 are patterned and etched to form short pillars, ideally directly on top of pillars 300 formed in the previous pattern and etch step. Some misalignment may occur, as shown in FIG. 6c, and can be tolerated. The photomask used to pattern pillars 300 may be reused in this patterning step.

In alternative embodiments, barrier layer 121, nickel oxide layer 118, and optionally barrier layer 123 can be formed before (and therefore beneath) diode layers 112, 114, and 116, and may be patterned in the same or in a separate patterning step. In this case, antifuse layer 117 is formed between nickel oxide layer 118 and the diode layers.

A dielectric material 108 is deposited over and between the short etched pillars including layers 123, 118, and 121, and a planarizing step, for example by CMP, removes overfill, exposing the top layer of the short pillars at a planarized surface.

Figure 6D:
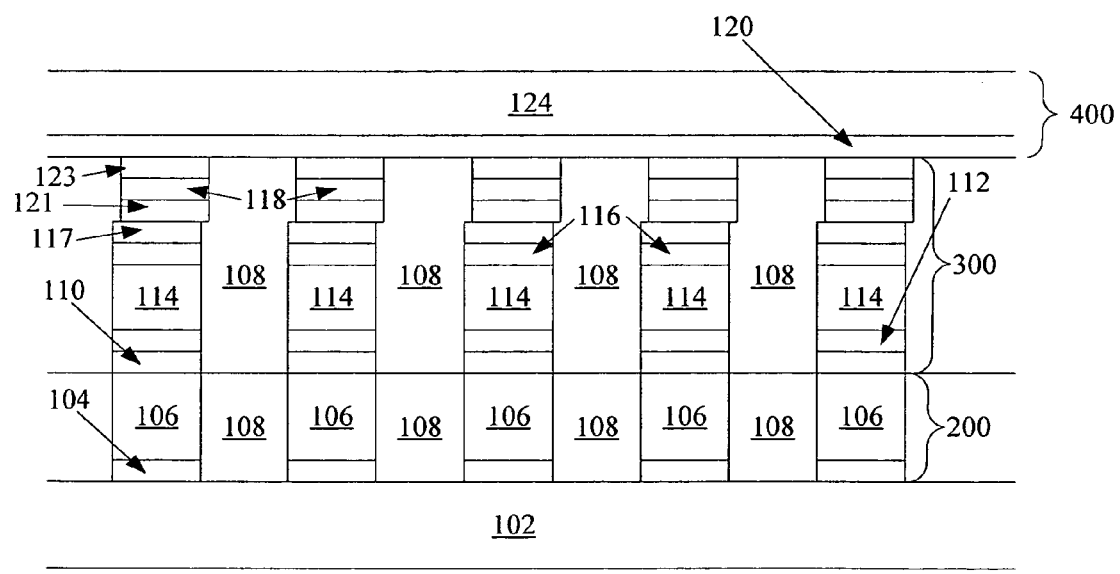

Next, turning to FIG. 6d, a conductive material or stack is deposited to form the top conductors 400. In a preferred embodiment, titanium nitride barrier layer 120 is deposited next, followed by tungsten layer 124. Top conductors 400 can be patterned and etched in the same manner as bottom conductors 200. Overlying second conductors 400 will preferably extend in a different direction from first conductors 200, preferably substantially perpendicular to them. Each pillar 300 should be formed at the intersection of a top conductor 400 and a bottom conductor 200. Some misalignment may be tolerated. A dielectric material (not shown) is deposited over and between conductors 400. The resulting structure, shown in FIG. 6d, is a bottom or first story of memory cells.

Additional memory levels can be formed above this first memory level. In some embodiments, conductors can be shared between memory levels; i.e. top conductor 400 would serve as the bottom conductor of the next memory level. In other embodiments, an interlevel dielectric is formed above the first memory level of FIG. 6d, its surface planarized, and construction of a second memory level begins on this planarized interlevel dielectric, with no shared conductors.

An anneal step crystallizes the silicon to polysilicon. This anneal may be done as a single step after fabrication of the memory levels is complete, or the temperatures required to grow the antifuse by thermal oxidation may be sufficient to crystallize the semiconductor material, and a separate anneal may not be required.

Photomasks are used during photolithography to pattern each layer. Certain layers are repeated in each memory level, and the photomasks used to form them may be reused. For example, a photomask defining the pillars 300 of FIG. 6d may be reused for each memory level. Each photomask includes reference marks used to properly align it. When a photomask is reused, reference marks formed in a second or subsequent use may interfere with the same reference marks formed during a prior use of the same photomask. Chen et al., U.S. patent application Ser. No. 11/097,496, "Masking of Repeated Overlay and Alignment Marks to Allow Reuse of Photomasks in a Vertical Structure," filed Mar. 31, 2005, and hereby incorporated by reference, describes a method to avoid such interference during the formation of a monolithic three dimensional memory array like that of the present invention.

In a monolithic three dimensional memory array according to preferred embodiments of the present invention, the circuitry is adapted to program each memory cell to one, two, three, or more programmed values, and erase it, multiple times.

Summarizing, what has been described is an example of a monolithic three dimensional memory array comprising: i) a first memory level monolithically formed above a substrate, the first memory level comprising: a) a plurality of substantially parallel, substantially coplanar first conductors; b) a plurality of substantially parallel, substantially coplanar second conductors above the first conductors; and c) a first plurality of memory cells, each memory cell comprising a dielectric rupture antifuse, a portion of one of the bottom conductors, and a portion of one of the top conductors, a layer of a resistivity-switching metal oxide or nitride compound, wherein the metal oxide or nitride compound includes only one metal, and wherein the dielectric rupture antifuse and the layer of resistivity-switching metal oxide or nitride are arranged electrically in series between the portion of the top conductor and the portion of the bottom conductor, and ii) a second memory level monolithically formed above the first memory level.

A detailed method of fabrication has been described, but many variations are possible. The resistivity-switching layer may be above the diode, as in FIG. 1, or below. The resistivity-switching layer may be part of a pillar, as in FIG. 1. Recall, however, that resistivity switching will take place only in a narrow switching region where current flows. If the resistivity-switching material is formed in a relatively high-resistivity state, it may be formed as part of the top conductor or the bottom conductor; the higher resistivity of the non-switching region will prevent adjacent cells from being shorted together.

The antifuse can be, for example, either above or below the resistivity-switching layer. The antifuse should be very close to the resistivity-switching layer, however; preferably either immediately adjacent to it or with only a thin barrier layer intervening.

If the resistivity-switching layer and the diode are both formed in a vertically oriented pillar, as in FIG. 1, the resistivity-switching layer and the diode may be formed in a single patterning step, or in separate patterning steps.

In some embodiments, in a very small array, the diode may be omitted and the memory cell can include only a resistivity-switching layer and an antifuse in series between conductors.

Any of the options just described may be combined.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory array comprising a first plurality of memory cells, each memory cell of the first plurality comprising:
 a dielectric rupture antifuse comprising a low-resistance rupture region through the dielectric rupture antifuse; and
 a resistance-switching memory element coupled in series with the dielectric rupture antifuse, the resistance-switching memory element comprising a layer of a resistivity-switching metal oxide or nitride compound, the metal oxide or nitride compound including only one metal.

2. The nonvolatile memory array of claim 1 further comprising circuitry to program the cells of the first plurality, wherein the circuitry is adapted to program each memory cell of the first plurality to programmed values multiple times.

3. The nonvolatile memory array of claim 1 wherein the resistivity-switching metal oxide or nitride is selected from the group consisting of $NiO_xO_y$, $Nb_xO_y$, $Ti_xO_y$, $Hf_xO_y$, $Al_xO_y$, $Mg_xO_y$, $Co_xO_y$, $Cr_xO_y$, $Cr_xO_y$, $V_xO_y$, $Zn_xO_y$, $Zr_xO_y$, $B_xN_y$, and $Al_xN_y$.

4. The nonvolatile memory array of claim 3 wherein the layer of resistivity-switching metal oxide or nitride compound includes a metal additive, wherein the metal additive is between about 0.01 and about 5 percent of the metal atoms in the layer of metal oxide or nitride compound.

5. The nonvolatile memory array of claim 4 wherein the metal additive is selected from the group consisting of cobalt, aluminum, gallium, indium, manganese, nickel, niobium, zirconium, titanium, hafnium, tantalum, magnesium, chromium, vanadium, boron, yttrium, and lanthanum.

6. The nonvolatile memory array of claim 1 wherein each cell of the first plurality of memory cells further comprises a diode arranged electrically in series with the resistance-switching element and the dielectric rupture antifuse.

7. The nonvolatile memory array of claim 6 wherein the diode is a semiconductor junction diode comprising silicon, germanium, or an alloy of silicon or germanium.

8. The nonvolatile memory array of claim 1 wherein the array is a monolithic three dimensional memory array comprising a first memory level monolithically formed above a semiconductor substrate, and a second memory level monolithically formed above the first memory level.

9. The nonvolatile memory array of claim 1 wherein the array comprises:
 a first memory cell wherein a first dielectric rupture antifuse of the first memory cell is ruptured, and wherein a first resistance-switching memory element of the first memory cell is in a low-resistance state; and
 a second memory cell wherein a second dielectric rupture antifuse of the second memory cell is ruptured, and wherein a second resistance-switching memory element of the second memory cell is in a high-resistance state.

10. The nonvolatile memory array of claim 9 wherein the second memory element has a resistance at least three times higher than a resistance of the first memory element.

11. The nonvolatile memory cell of claim 1 wherein the array comprises:
 a first memory cell wherein a first dielectric rupture antifuse of the first memory cell is ruptured and wherein a first resistance-switching memory element of the first memory cell is in a first resistance state;
 a second memory cell wherein a second dielectric rupture antifuse of the second memory cell is ruptured and wherein a second resistance-switching memory element of the second memory cell is in a second resistance state different from the first resistance state; and
 a third memory cell wherein a third dielectric rupture antifuse of the third memory cell is ruptured and wherein a third resistance-switching memory element of the third memory cell is in a third resistance state different from the first resistance state and the second resistance state,
 wherein the first, second, and third resistance states are detectably different and correspond to first, second, and third data states.

12. A monolithic three dimensional memory array comprising:
 i) a first memory level monolithically formed above a substrate, the first memory level comprising:
  a) a plurality of substantially parallel, substantially coplanar bottom first conductors;
  b) a plurality of substantially parallel, substantially coplanar top second conductors above the bottom first conductors; and
  c) a first plurality of memory cells, each memory cell comprising a dielectric rupture antifuse comprising a low-resistance rupture region through the dielectric rupture antifuse, a portion of one of the bottom first conductors, a portion of one of the top second conductors, and a resistance-switching element coupled in series with the dielectric rupture antifuse, the resistance-switching element comprising a layer of a resistivity-switching metal oxide or nitride compound, wherein the metal oxide or nitride compound includes only one metal, and wherein the dielectric rupture antifuse and the layer of resistivity-switching metal oxide or nitride are arranged electrically in series between the portion of the top second conductor and the portion of the bottom first conductor, and
 ii) a second memory level monolithically formed above the first memory level.

13. The monolithic three dimensional memory array of claim 12 wherein each memory cell of the first plurality further comprises a diode arranged electrically in series with the dielectric rupture antifuse and the layer of resistivity-switching metal oxide or nitride compound between the portion of the bottom conductor and the portion of the top conductor.

14. The monolithic three dimensional memory array of claim 13 wherein each diode of the first plurality of memory cells comprises silicon, germanium, or an alloy of silicon or germanium.

15. The monolithic three dimensional memory array of claim 14 wherein the silicon, germanium or alloy of silicon or germanium of the diode is polycrystalline.

16. The monolithic three dimensional memory array of claim 12 wherein the resistivity-switching metal oxide or nitride compound is selected from the group consisting of $NiO_xO_y$, $Nb_xO_y$, $Ti_xO_y$, $Hf_xO_y$, $Al_xO_y$, $Mg_xO_y$, $CO_xO_y$, $Cr_xO_y$, $V_xO_y$, $Zn_xO_y$, $Zr_xO_y$, $B_xN_y$, and $Al_xN_y$.

17. The monolithic three dimensional memory array of claim 16 wherein the resistivity-switching metal oxide or nitride compound is selected from the group consisting of $NiO$, $Nb_2O_5$, $TiO_2$, $HfO_2$, $Al_2O_3$, $MgO_x$, $CoO$, $CrO_2$, $VO$, $ZnO$, $ZrO$, $BN$, and $AlN$.

18. The monolithic three dimensional memory array of claim 12 wherein each memory cell of the first plurality is a rewriteable memory cell.

19. The monolithic three dimensional memory array of claim 12 wherein the substrate is a semiconductor material.

20. The monolithic three dimensional memory array of claim 12 wherein the bottom conductors comprise tungsten.

21. A method for programming a nonvolatile memory cell, wherein the cell comprises a dielectric rupture antifuse coupled in series with a resistance-switching memory element, the resistance-switching memory element comprising a layer of a resistivity-switching metal oxide or nitride compound, the metal oxide or nitride compound including only one metal, the method comprising:
 forming a low-resistance rupture region through the dielectric rupture antifuse;
 forming a switching region in the layer of resistivity-switching metal oxide or nitride compound;
 putting the switching region in a low-resistivity set state;
 applying a first reset pulse to put the switching region in a high-resistivity reset state;
 after applying the first reset pulse, applying a first programming set pulse to put the switching region in a programmed set state wherein a first data state of the memory cell is stored in a resistivity state of the switching region; and
 after applying the first programming set pulse, applying a first programming reset pulse to put the switching region in a programmed reset state, wherein a second data state of the memory cell is stored in the resistivity state of the switching region.

22. The memory cell of claim 1 wherein the resistance-switching element is adapted to reversibly switch resistance and each memory cell is adapted to be rewriteable.

23. The memory cell of claim 1 wherein the memory cell is adapted to have a rewriteable data state, the rewriteable data state being stored in the resistance-switching element and not in the dielectric rupture antifuse.

24. The memory cell of claim 1 wherein the resistance-switching element and the dielectric rupture antifuse are in contact.

25. The memory cell of claim 1, further comprising a barrier layer disposed between the resistance-switching element and the dielectric rupture antifuse.

26. The memory cell of claim 25, wherein the barrier layer is thinner than the layer of the resistivity-switching metal oxide or nitride compound.

27. The monolithic three dimensional memory array of claim 12 wherein the resistance-switching element is adapted to reversibly switch resistance.

28. The monolithic three dimensional memory array of claim 12 wherein each memory cell is adapted to have a rewriteable data state, the rewriteable data state being stored in the resistance-switching element and not in the dielectric rupture antifuse.

29. The monolithic three dimensional memory array of claim 12 wherein the resistance-switching element and the dielectric rupture antifuse are in contact.

30. The monolithic three dimensional memory array of claim 12, further comprising a barrier layer disposed between the resistance-switching element and the dielectric rupture antifuse.

31. The monolithic three dimensional memory array of claim 30, wherein the barrier layer is thinner than the layer of the resistivity-switching metal oxide or nitride compound.

* * * * *

UNITED STATES PATENT AND TRADEMARK OFFICE
CERTIFICATE OF CORRECTION

| | | |
|---|---|---|
| PATENT NO. | : 7,829,875 B2 | Page 1 of 1 |
| APPLICATION NO. | : 11/395421 | |
| DATED | : November 9, 2010 | |
| INVENTOR(S) | : Roy E. Scheuerlein | |

It is certified that error appears in the above-identified patent and that said Letters Patent is hereby corrected as shown below:

Column 14, line 48, "the group consisting of $NiO_xO_y$, $Nb_xO_y$, $Ti_xO_y$, $Hf_xO_y$, $Al_xO_y$," should be changed to "the group consisting of $Ni_xO_y$, $Nb_xO_y$, $Ti_xO_y$, $Hf_xO_y$, $Al_xO_y$,"

Column 16, line 14, " $NiO_xO_y$, $Nb_xO_y$, $Ti_xO_y$, $Hf_xO_y$, $Al_xO_y$, $Mg_xO_y$, $CO_xO_y$, $Cr_xO_y$," should be changed to "$Ni_xO_y$, $Nb_xO_y$, $Ti_xO_y$, $Hf_xO_y$, $Al_xO_y$, $Mg_xO_y$, $Co_xO_y$, $Cr_xO_y$,"

Signed and Sealed this
Twenty-second Day of February, 2011

David J. Kappos
*Director of the United States Patent and Trademark Office*